(12) United States Patent
Ohashi et al.

(10) Patent No.: US 11,043,377 B1
(45) Date of Patent: Jun. 22, 2021

(54) METHOD OF MANUFACTURING SEMICONDUCTOR DEVICE

(71) Applicant: Kokusai Electric Corporation, Tokyo (JP)

(72) Inventors: Naofumi Ohashi, Toyama (JP); Yoshiro Hirose, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/818,557

(22) Filed: Mar. 13, 2020

(30) Foreign Application Priority Data

Jan. 15, 2020 (JP) .............................. JP2020-004540

(51) Int. Cl.
*H01L 21/02* (2006.01)
*C23C 16/44* (2006.01)
*C23C 16/04* (2006.01)
*C23C 16/34* (2006.01)

(52) U.S. Cl.
CPC ........ *H01L 21/02304* (2013.01); *C23C 16/04* (2013.01); *C23C 16/345* (2013.01); *C23C 16/4405* (2013.01); *H01L 21/0217* (2013.01); *H01L 21/02271* (2013.01); *H01L 21/02301* (2013.01); *H01L 21/02315* (2013.01)

(58) Field of Classification Search
CPC ........... H01L 21/02304; H01L 21/0217; H01L 21/02271; H01L 21/02301; H01L 21/02315; C23C 16/04; C23C 16/345; C23C 16/4405
See application file for complete search history.

(56) References Cited

U.S. PATENT DOCUMENTS

| 5,207,836 | A | * | 5/1993 | Chang ................. C23C 16/4405 134/1 |
| 2013/0025624 | A1 | * | 1/2013 | Kim .................... C23C 16/4405 134/1.2 |
| 2016/0303620 | A1 | * | 10/2016 | Kim .................... C23C 16/4405 |
| 2017/0356086 | A1 | * | 12/2017 | Iwaji .................... C23C 16/303 |
| 2018/0080121 | A1 | | 3/2018 | Longrie et al. |

(Continued)

FOREIGN PATENT DOCUMENTS

| JP | 2001-345278 A | 12/2001 |
| KR | 10-2001-0104260 A | 11/2001 |
| KR | 10-2017-0138954 A | 12/2017 |

OTHER PUBLICATIONS

Office Action in corresponding Korean Patent Application No. 10-2020-0027762, dated Jan. 4, 2021, with English translation.

*Primary Examiner* — Shaun M Campbell
(74) *Attorney, Agent, or Firm* — Edell, Shapiro & Finnan, LLC

(57) ABSTRACT

Described herein is a technique capable of selectively forming a film in a film-forming step. According to one aspect of the technique, there is provided a method of manufacturing a semiconductor device including: (a) selectively forming a film on a substrate by supplying a process gas into a process chamber accommodating the substrate, wherein an inhibitor layer is formed on a portion of the substrate such that the substrate acquires a selectivity in an adsorption of the process gas; (b) supplying a cleaning gas containing a component contained in the inhibitor layer into the process chamber accommodating no substrate; and (c) removing a residual component of the cleaning gas in the process chamber.

6 Claims, 7 Drawing Sheets

(56) References Cited

U.S. PATENT DOCUMENTS

| | | | |
|---|---|---|---|
| 2018/0166270 A1* | 6/2018 | Cho | H01L 21/0228 |
| 2020/0013616 A1* | 1/2020 | Abel | C23C 16/0245 |
| 2020/0243330 A1* | 7/2020 | Kubo | C23C 16/45565 |

* cited by examiner

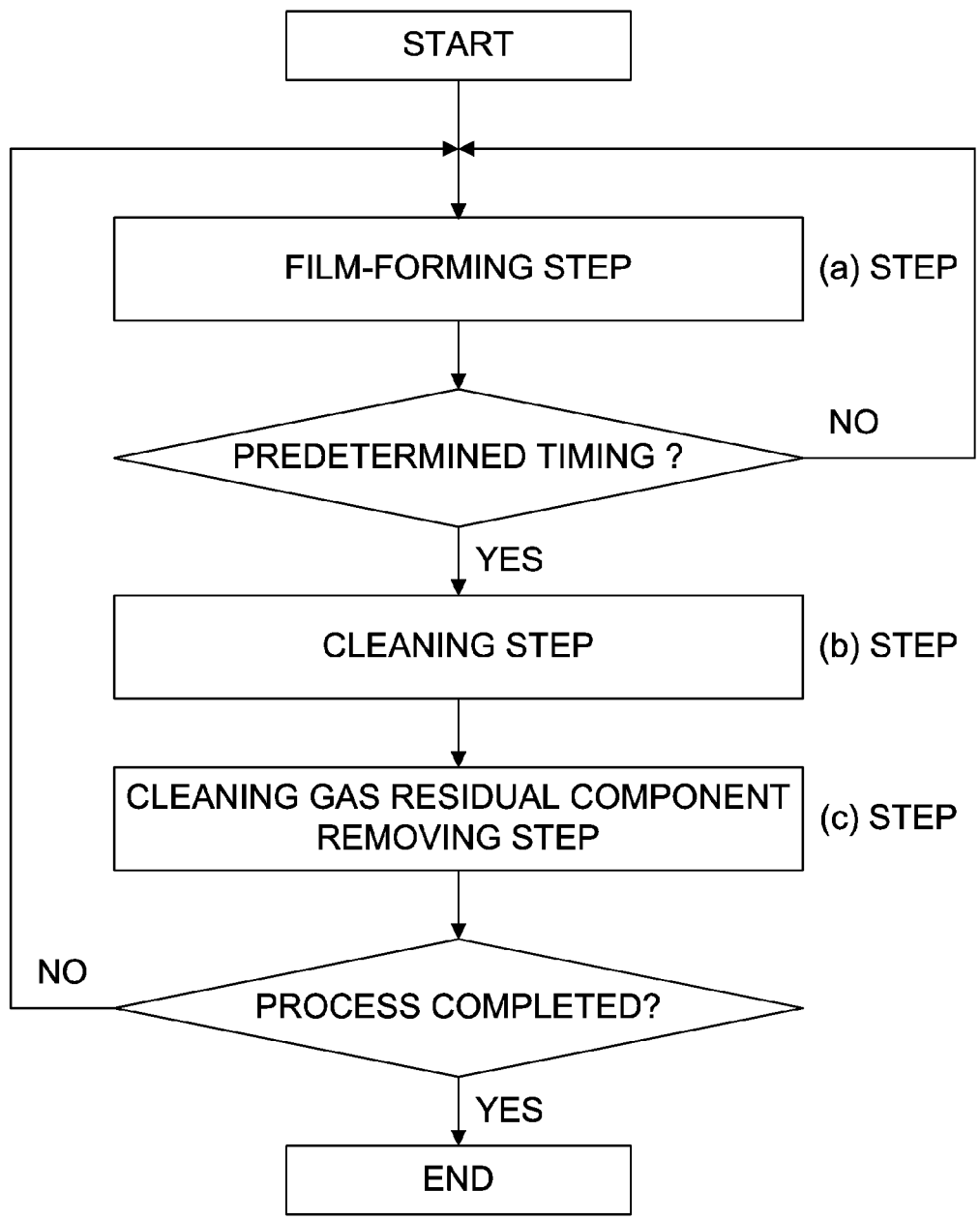

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2020-004540 filed on Jan. 15, 2020, the entire contents of which are hereby incorporated by reference.

TECHNICAL FIELD

The present disclosure relates to a method of manufacturing a semiconductor device.

BACKGROUND

As a part of manufacturing processes of a semiconductor device, a cleaning step may be performed. According to the cleaning step, by supplying a cleaning gas into a process chamber where a substrate is processed, it is possible to remove substances such as by-products attached to the process chamber.

After the cleaning step is performed, a residual component of the cleaning gas may remain in the process chamber. When the cleaning gas contains a component contained in an inhibitor layer formed on the substrate, a film may not be selectively formed in a film-forming step if the residual component of the cleaning gas remains in the process chamber.

SUMMARY

Described herein is a technique capable of selectively forming a film in a film-forming step.

According to one aspect of the technique of the present disclosure, there is provided a substrate processing apparatus including: (a) selectively forming a film on a substrate by supplying a process gas into a process chamber accommodating the substrate, wherein an inhibitor layer is formed on a portion of the substrate such that the substrate acquires a selectivity in an adsorption of the process gas; (b) supplying a cleaning gas containing a component contained in the inhibitor layer into the process chamber accommodating no substrate; and (c) removing a residual component of the cleaning gas in the process chamber.

BRIEF DESCRIPTION OF THE DRAWINGS

FIG. 8 is a flowchart schematically illustrating a film-forming step, a cleaning step and a cleaning gas residual component removing step of a substrate processing according to other embodiments described herein.

DETAILED DESCRIPTION

Hereinafter, embodiments according to the technique of the present disclosure will be described with reference to the drawings.

In the following description, a substrate processing apparatus is an example of an apparatus used to perform a substrate processing in manufacturing processes of a semiconductor device. That is, the substrate processing apparatus is configured to perform a predetermined processing (also referred to as the "substrate processing") on a substrate to be processed. For example, a silicon wafer (hereinafter, also simply referred to as a "wafer") serving as a semiconductor substrate on which the semiconductor device is formed may be used as the substrate to be processed. In the present specification, the term "wafer" may refer to "a wafer itself" or may refer to "a wafer and a stacked structure (aggregated structure) of predetermined layers or films formed on a surface of the wafer". That is, the term "wafer" may collectively refer to "the wafer and the layers or the films formed on the surface of the wafer. In addition, the term "surface of a wafer" may refer to "a surface (exposed surface) of a wafer itself" or may refer to "a surface of a predetermined layer or a film formed on the wafer, i.e. a top surface (uppermost surface) of the wafer as a stacked structure". In the present specification, the terms "substrate" and "wafer" may be used as substantially the same meaning. For example, as the predetermined processing (substrate processing), a process such as an oxidation process, a diffusion process, an annealing process, an etching process, a pre-cleaning process, a chamber cleaning process and a film-forming process may be performed. Specifically, the embodiments will be described by way of an example in which the film-forming process is performed as the substrate processing.

Embodiments

Hereinafter, one or more embodiments (hereinafter, simply referred to as "embodiments") according to the technique of the present disclosure will be described with reference to FIGS. 1 through 4B.

(1) Configuration of Substrate Processing Apparatus

Figure 1:
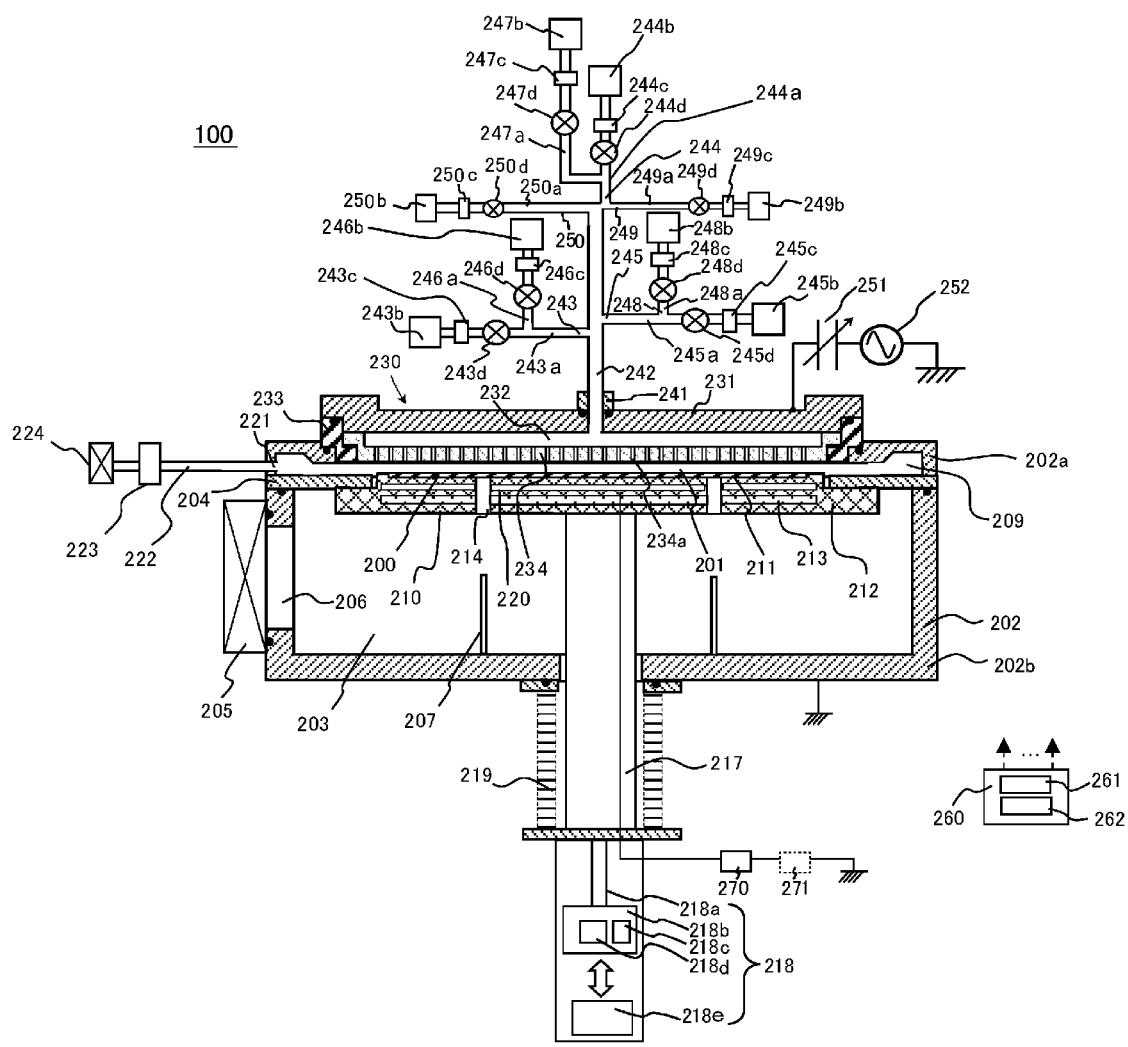
FIG. 1 schematically illustrates a single-wafer type substrate processing apparatus preferably used in one or more embodiments described herein.

Hereinafter, a configuration of a substrate processing apparatus preferably used in the embodiments will be described. The embodiments will be described by way of an example in which a single-wafer type substrate processing apparatus configured to process a wafer to be processed one by one is used as the substrate processing apparatus preferably used in the embodiments. FIG. 1 schematically illustrates the single-wafer type substrate processing apparatus preferably used in the embodiments.

Process Vessel

As shown in FIG. 1, a substrate processing apparatus 100 preferably used in the embodiments includes a process vessel 202. For example, the process vessel 202 is a flat and sealed vessel whose cross-section is circular. The process vessel 202 is made of a metal material such as aluminum (Al) and stainless steel (SUS). The process vessel 202 is constituted by an upper vessel 202a and a lower vessel 202b.

A partition plate 204 is provided between the upper vessel 202a and the lower vessel 202b.

A process chamber 201 serving as a process space where a wafer 200 is processed and a transfer chamber 203 serving as a transfer space through which the wafer 200 is transferred into or out of the process chamber 201 are provided in the process vessel 202.

An exhaust buffer chamber 209 is provided in the vicinity of an outer peripheral edge inside the upper vessel 202a. The exhaust buffer chamber 209 functions as a buffer space when a gas such as a process gas in the process chamber 201 is exhausted through an outer peripheral portion of the process chamber 201. Therefore, the exhaust buffer chamber 209 includes a space provided so as to surround the outer peripheral portion of the process chamber 201. That is, when viewed from above, the exhaust buffer chamber 209 includes the space of a ring shape (annular shape) on the outer peripheral portion of the process chamber 201.

A substrate loading/unloading port 206 is provided on a side surface of the lower vessel 202b adjacent to a gate valve 205. The wafer 200 is transferred (moved) between a vacuum transfer chamber (not shown) and the transfer chamber 203 through the substrate loading/unloading port 206. Lift pins 207 are provided at a bottom of the lower vessel 202b.

Substrate Support

A substrate support 210 capable of supporting the wafer 200 is provided in the process chamber 201. The substrate support 210 includes a substrate support table 212 with a substrate placing surface 211 on which the wafer 200 is placed. A heater 213 configured to adjust a temperature of the wafer 200 placed on the substrate placing surface 211 and a bias electrode 220 configured to apply a bias to components such as the wafer 200 are embedded in the substrate support table 212. Through-holes 214 penetrated by the lift pins 207 are provided at the substrate support table 212 corresponding to the locations of the lift pins 207.

An impedance adjusting mechanism (also referred to as an "impedance adjusting part") 270 configured to adjust a bias voltage applied to the bias electrode 220 embedded in the substrate support table 212 and an impedance adjustment power supply 271 are individually connected to the bias electrode 220.

The substrate support table 212 is supported by a shaft 217. The shaft 217 penetrates the bottom of the process vessel 202. The shaft 217 is connected to an elevating mechanism 218 outside the process vessel 202.

The elevating mechanism 218 mainly includes a support shaft 218a configured to support the shaft 217 and an actuator 218b configured to elevate, lower or rotate the support shaft 218a. For example, the actuator 218b may include an elevating mechanism 218c such as a motor configured to elevate or lower the support shaft 218a and a rotating mechanism 218d such as a gear configured to rotate the support shaft 218a.

The elevating mechanism 218 may further include an instruction part 218e which is a part of the elevating mechanism 218 and configured to control the actuator 218b to elevate, lower or rotate the support shaft 218a. The instruction part 218e is electrically connected to a controller 260 described later. The actuator 218b may be controlled by the instruction part 218e based on an instruction from the controller 260.

The wafer 200 placed on the substrate placing surface 211 of the substrate support table 212 may be elevated and lowered by operating the elevating mechanism 218 by elevating and lowering the shaft 217 and the substrate support table 212. A bellows 219 covers a lower end portion of the shaft 217 to maintain the process chamber 201 airtight.

When the wafer 200 is transferred, the substrate support table 212 is moved downward until the substrate placing surface 211 faces the substrate loading/unloading port 206 (that is, the substrate support table 212 is moved to a wafer transfer position). When the wafer 200 is processed, the substrate support table 212 is moved upward until the wafer 200 reaches a processing position (also referred to as a "wafer processing position") in the process chamber 201 as shown in FIG. 1. Specifically, when the substrate support table 212 is lowered to the wafer transfer position, upper end portions of the lift pins 207 protrude from an upper surface of the substrate placing surface 211, and the lift pins 207 support the wafer 200 from thereunder. When the substrate support table 212 is elevated to the wafer processing position, the lift pins 207 are buried from the upper surface of the substrate placing surface 211, and the substrate placing surface 211 supports the wafer 200 from thereunder.

Shower Head

A shower head 230 serving as a gas dispersion mechanism is provided at an upper portion of the process chamber 201. That is, the shower head 230 is provided upstream of the process chamber 201 in reference to a gas supply direction. A gas introduction port 241 is provided at a cover 231 of the shower head 230. The gas introduction port 241 is configured to communicate with a gas supply system described later. The gas such as the process gas introduced through the gas introduction port 241 is supplied to a buffer space 232 of the shower head 230.

The cover 231 of the shower head 230 is made of a conductive metal. The cover 231 is used as an electrode configured to generate plasma in the buffer space 232 or in the process chamber 201. An insulating block 233 is provided between the cover 231 and the upper vessel 202a. The insulating block 233 electrically insulates the cover 231 from the upper vessel 202a.

The shower head 230 includes a dispersion plate 234 configured to disperse the gas supplied through the gas supply system via the gas introduction port 241. An upstream side of the dispersion plate 234 is referred to as the buffer space 232, and a downstream side of the dispersion plate 234 is referred to as the process chamber 201. The dispersion plate 234 is provided with a plurality of through-holes 234a. The dispersion plate 234 is arranged to face the substrate placing surface 211.

Plasma Generator

A matching mechanism 251 and a high frequency power supply 252 are connected to the cover 231 of the shower head 230. By adjusting the impedance by the matching mechanism 251 and the high frequency power supply 252, the plasma is generated in the shower head 230 and the process chamber 201

Gas Supply System

A common gas supply pipe 242 is connected to the cover 231 of the shower head 230 so as to communicate with the gas introduction port 241. The common gas supply pipe 242 communicates with the buffer space 232 in the shower head 230 via the gas introduction port 241. In addition, a first gas supply pipe 243a, a second gas supply pipe 244a, a third gas supply pipe 245a, a fourth gas supply pipe 249a and a fifth gas supply pipe 250a are connected to the common gas supply pipe 242.

A source gas, which is one of process gases, is supplied mainly though a source gas supply system 243. The source gas supply system 243 is a part of the gas supply system, and includes the first gas supply pipe 243a. A reactive gas, which is another of the process gases, is supplied mainly though a reactive gas supply system 244 (hereinafter, the source gas and the reactive gas as the process gases may also be collectively or individually referred to as the "process gas"). The reactive gas supply system 244 is a part of the gas supply system, and includes the second gas supply pipe 244a. When processing the wafer 200, an inert gas serving as a purge gas is mainly supplied though a purge gas supply system 245. The purge gas supply system 245 is a part of the gas supply system, and includes the third gas supply pipe 245a. When cleaning the shower head 230 or the process chamber 201, a cleaning gas is mainly supplied though the purge gas supply system 245. An inhibitor layer forming gas is supplied mainly though an inhibitor layer forming gas supply system 249. The inhibitor layer forming gas supply system 249 is a part of the gas supply system, and includes the fourth gas supply pipe 249a. A cleaning gas residual component removing gas (hereinafter, also simply referred to as a "residual component removing gas") is supplied mainly though a cleaning gas residual component removing gas supply system (hereinafter, also simply referred to as a "residual component removing gas supply system") 250. The residual component removing gas supply system 250 is a part of the gas supply system, and includes the fifth gas supply pipe 250a. Among the gases supplied through the gas supply system, the source gas may also be referred to as a "first gas", the reactive gas may also be referred to as a "second gas", the inert gas may also be referred to as a "third gas", the cleaning gas (for the process chamber 201) may also be referred to as a "fourth gas", the inhibitor layer forming gas may also be referred to as a "fifth gas", and the residual component removing gas may also be referred to as a "sixth gas".

As described above, the first gas supply pipe 243a, the second gas supply pipe 244a, the third gas supply pipe, the fourth gas supply pipe 249a and the fifth gas supply pipe 250a are connected to the common gas supply pipe 242. Thereby, the common gas supply pipe 242 is configured to selectively supply the gases such as the source gas (first gas) or the reactive gas (second gas) serving as the process gas, the inert gas (third gas) serving as the purge gas or the cleaning gas (fourth gas), the inhibitor layer forming gas (fifth gas) and the residual component removing gas (sixth gas) to the process chamber 201 through the buffer space 232 of the shower head 230. That is, the common gas supply pipe 242 functions as a "first supply pipe" configured to supply a gas including at least one among the process gas, the purge gas, the cleaning gas, the inhibitor layer forming gas and the residual component removing gas to the process chamber 201.

Source Gas Supply System

A source gas supply source 243b, a mass flow controller (MFC) 243c serving as a flow rate controller (also referred to as a "flow rate control mechanism") and a valve 243d serving as an opening/closing valve are provided at the first gas supply pipe 243a in the sequential order from an upstream side to a downstream side of the first gas supply pipe 243a. The source gas is supplied into the shower head 230 via the first gas supply pipe 243a provided with the MFC 243c and the valve 243d and the common gas supply pipe 242.

The source gas (first gas) is one of the process gases. For example, the source gas contains silicon (Si) serving as a first element. Specifically, a gas such as dichlorosilane ($SiH_2Cl_2$, abbreviated as DCS) gas and tetraethoxysilane ($Si(OC_2H_5)_4$, abbreviated as TEOS) gas may be used as the source gas. Hereinafter, the embodiments will be described by way of an example in which the DCS gas is used as the source gas.

The source gas supply system 243 is constituted mainly by the first gas supply pipe 243a, the MFC 243c and the valve 243d. The source gas supply system 243 may further include the source gas supply source 243b and a first inert gas supply system described later. In addition, since the source gas supply system 243 is configured to supply the source gas which is one of the process gases, the source gas supply system 243 is a part of a process gas supply system.

A downstream end of a first inert gas supply pipe 246a is connected to the first gas supply pipe 243a downstream of the valve 243d provided at the first gas supply pipe 243a. An inert gas supply source 246b, an MFC 246c and a valve 246d are provided at the first inert gas supply pipe 246a in the sequential order from an upstream side to a downstream side of the first inert gas supply pipe 246a. The inert gas is supplied into the shower head 230 via the first inert gas supply pipe 246a provided with the MFC 246c and the valve 246d and the first gas supply pipe 243a.

The inert gas acts as a carrier gas of the source gas. It is preferable that a gas that does not react with the source gas is used as the inert gas. Specifically, for example, nitrogen ($N_2$) gas may be used as the inert gas. Instead of the $N_2$ gas, for example, a rare gas such as helium (He) gas, neon (Ne) gas and argon (Ar) gas may be used as the inert gas.

The first inert gas supply system is constituted mainly by the first inert gas supply pipe 246a, the MFC 246c and the valve 246d. The first inert gas supply system may further include the inert gas supply source 246b and the first gas supply pipe 243a. As described above, the source gas supply system 243 may further include the first inert gas supply system.

Reactive Gas Supply System

A reactive gas supply source 244b, an MFC 244c and a valve 244d are provided at the second gas supply pipe 244a in the sequential order from an upstream side to a downstream side of the second gas supply pipe 244a. The reactive gas is supplied into the shower head 230 via the second gas supply pipe 244a provided with the MFC 244c and the valve 244d and the common gas supply pipe 242.

The reactive gas (second gas) is another of the process gases. For example, the reactive gas contains a second element (for example, nitrogen) different from the first element (for example, silicon) contained in the source gas. Specifically, for example, ammonia ($NH_3$) gas serving as a nitrogen (N)-containing gas may be used as the reactive gas.

The reactive gas supply system 244 is constituted mainly by the second gas supply pipe 244a, the MFC 244c and the valve 244d. The reactive gas supply system 244 may further include the reactive gas supply source 244b and a second inert gas supply system described later. In addition, since the reactive gas supply system 244 is configured to supply the reactive gas which is another of the process gases, the reactive gas supply system 244 is a part of the process gas supply system.

A downstream end of a second inert gas supply pipe 247a is connected to the second gas supply pipe 244a at a downstream side of the valve 244d provided at the second gas supply pipe 244a. An inert gas supply source 247b, an MFC 247c and a valve 247d are provided at the second inert gas supply pipe 247a in the sequential order from an upstream side to a downstream side of the second inert gas supply pipe 247a. The inert gas is supplied into the shower head 230 via the second inert gas supply pipe 247a provided with the MFC 247c and the valve 247d and the second gas supply pipe 244a.

The inert gas acts as a carrier gas or a dilution gas of the reactive gas. Specifically, for example, the nitrogen ($N_2$) gas may be used as the inert gas. Instead of the $N_2$ gas, for example, a rare gas such as helium (He) gas, neon (Ne) gas and argon (Ar) gas may be used as the inert gas.

The second inert gas supply system is constituted mainly by the second inert gas supply pipe 247a, the MFC 247c and the valve 247d. The second inert gas supply system may further include the inert gas supply source 247b and the second gas supply pipe 244a. As described above, the reactive gas supply system 244 may further include the second inert gas supply system.

Purge Gas Supply System

A purge gas supply source 245b, an MFC 245c and a valve 245d are provided at the third gas supply pipe 245a in the sequential order from an upstream side to a downstream side of the third gas supply pipe 245a. When processing the wafer 200 according to a substrate processing described later, the inert gas serving as the purge gas is supplied into the shower head 230 via the third gas supply pipe 245a provided with the MFC 245c and the valve 245d and the common gas supply pipe 242. When cleaning the shower head 230 or the process chamber 201 according to a process space cleaning step described later, the inert gas serving as a carrier gas or a dilution gas of the cleaning gas is supplied into the shower head 230 via the MFC 245c, the valve 245d and the common gas supply pipe 242 as necessary.

The inert gas supplied from the purge gas supply source 245b acts as the purge gas of purging the gas remaining in the process vessel 202 or in the shower head 230 in the substrate processing, and may act as the carrier gas or the dilution gas of the cleaning gas in the process space cleaning step. Specifically, for example, the nitrogen ($N_2$) gas may be used as the inert gas. Instead of the $N_2$ gas, for example, a rare gas such as helium (He) gas, neon (Ne) gas and argon (Ar) gas may be used as the inert gas.

The purge gas supply system 245 is constituted mainly by the third gas supply pipe 245a, the MFC 245c and the valve 245d. The purge gas supply system 245 may further include the purge gas supply source 245b and a process space cleaning gas supply system 248 described later.

Process Space Cleaning Gas Supply System

A downstream end of a process space cleaning gas supply pipe 248a is connected to the third gas supply pipe 245a at a downstream side of the valve 245d provided at the third gas supply pipe 245a. A process space cleaning gas supply source 248b, an MFC 248c and a valve 248d are provided at the process space cleaning gas supply pipe 248a in the sequential order from an upstream side to a downstream side of the process space cleaning gas supply pipe 248a. In the process space cleaning step, the cleaning gas is supplied into the shower head 230 via the process space cleaning gas supply pipe 248a provided with the MFC 248c and the valve 248d, the third gas supply pipe 245a and the common gas supply pipe 242.

In the process space cleaning step, the cleaning gas (fourth gas) supplied from the process space cleaning gas supply source 248b acts as a cleaning gas of removing substances such as by-products (also referred to as "reaction by-products") attached to the shower head 230 and the process vessel 202. Specifically, for example, a fluorine (F)-containing gas such as nitrogen trifluoride ($NF_3$) gas, hydrogen fluoride (HF) gas, chlorine trifluoride ($ClF_3$) gas and fluorine ($F_2$) gas may be used as the cleaning gas.

Hereinafter, the embodiments will be described by way of an example in which the $NF_3$ gas is used as the cleaning gas.

The process space cleaning gas supply system 248 is constituted mainly by the process space cleaning gas supply pipe 248a, the MFC 248c and the valve 248d. The process space cleaning gas supply system 248 may further include the process space cleaning gas supply source 248b and the third gas supply pipe 245a. In addition, the purge gas supply system 245 may further include the process space cleaning gas supply system 248.

Inhibitor Layer Forming Gas Supply System

An inhibitor layer forming gas supply source 249b, an MFC 249c and a valve 249d are provided at the fourth gas supply pipe 249a in the sequential order from an upstream side to a downstream side of the fourth gas supply pipe 249a. The inhibitor layer forming gas is supplied into the shower head 230 via the fourth gas supply pipe 249a provided with the MFC 249c and the valve 249d and the common gas supply pipe 242.

The inhibitor layer forming gas (fifth gas) is supplied onto the wafer 200 to form an inhibitor layer on the wafer 200. The inhibitor layer inhibits the adsorption of the DCS supplied in a film-forming step described later. Specifically, for example, a fluorine (F)-containing gas such as carbon tetrafluoride ($CF_4$) gas, the $NF_3$ gas and the $F_2$ gas may be used as the inhibitor layer forming gas. Hereinafter, the embodiments will be described by way of an example in which the $CF_4$ gas is used as the inhibitor layer forming gas.

Cleaning Gas Residual Component Removing Gas Supply System

A cleaning gas residual component removing gas supply source (hereinafter, also simply referred to as a "residual component removing gas supply source") 250b, an MFC 250c and a valve 250d are provided at the fifth gas supply pipe 250a in the sequential order from an upstream side to a downstream side of the fifth gas supply pipe 250a. The residual component removing gas is supplied into the shower head 230 via the fifth gas supply pipe 250a provided with the MFC 250c and the valve 250d and the common gas supply pipe 242.

The residual component removing gas (sixth gas) supplied from the residual component removing gas supply source 250b acts as a gas of removing a residual component of the cleaning gas remaining in the process chamber 201 after the cleaning step is completed. Specifically, for example, a hydrogen-containing gas such as hydrogen ($H_2$) gas may be used as the residual component removing gas.

Exhaust System

An exhaust pipe 222 is connected to an inside of the exhaust buffer chamber 209 via an exhaust port 221 provided on an upper surface or a side surface of the exhaust buffer chamber 209. Thus, the exhaust pipe 222 communicates with an inside of the process chamber 201 via the exhaust port 221 and the exhaust buffer chamber 209.

An APC (Automatic Pressure Controller) valve 223 serving as a pressure controller is provided at the exhaust pipe 222. The APC valve 223 is configured to adjust (control) an inner pressure of the process chamber 201 communicating with the exhaust buffer chamber 209 to a predetermined pressure. The APC valve 223 includes a valve body (not shown) capable of adjusting the opening degree thereof. The APC valve 223 is configured to adjust a conductance of the exhaust pipe 222 in accordance with an instruction from a controller 260 described later. Hereinafter, the APC valve 223 provided at the exhaust pipe 222 may be simply referred to as the valve 223.

A vacuum pump 224 is provided at the exhaust pipe 222 at a downstream side of the APC valve 223. The vacuum pump 224 is configured to exhaust an inner atmosphere of the exhaust buffer chamber 209 and an inner atmosphere of the process chamber 201 communicating with the exhaust buffer chamber 209 via the exhaust pipe 222. Thus, the exhaust pipe 222 functions as an exhaust pipe configured to exhaust the gas from the process chamber 201.

An exhaust system (also referred to as a "gas exhaust system") is constituted mainly by the exhaust pipe 222, the APC valve 223 and the vacuum pump 224.

Controller

The substrate processing apparatus 100 includes the controller 260 configured to control operations of the components of the substrate processing apparatus 100. The controller 260 includes at least an arithmetic unit 261 and a memory device 262. The controller 260 is connected to the components of the substrate processing apparatus 100 described above, calls a program or a recipe from the memory device 262 in accordance with an instruction from a host controller or a user, and controls the operations of the components of the substrate processing apparatus 100 according to the contents of the instruction. Specifically, the controller 260 may be configured to control the operations of the components such as the gate valve 205, the elevating mechanism 218, the heater 213, the high frequency power supply 252, the matching mechanism 251, the MFCs 243c through 250c, the valves 243d through 250d, the APC valve 223, the impedance adjusting mechanism 270, the impedance adjustment power supply 271 and the vacuum pump 224.

The controller 260 may be embodied by a dedicated computer or by a general-purpose computer. For example, the controller 260 may be embodied by preparing an external memory device storing the program described above and by installing the program onto the general-purpose computer using the external memory device. For example, the external memory device may include a magnetic tape, a magnetic disk such as a flexible disk and a hard disk, an optical disk such as a CD and a DVD, a magneto-optical disk such as an MO and a semiconductor memory such as a USB memory and a memory card.

The means for providing the program to the computer is not limited to the external memory device. For example, the program may be supplied to the computer (general-purpose computer) using communication means such as the Internet and a dedicated line. In addition, the memory device 262 or the external memory device may be embodied by a non-transitory computer readable recording medium. Hereafter, the memory device 262 and the external memory device may be collectively referred to as the recording medium. In the present specification, the term "recording medium" may refer to only the memory device 262, may refer to only the external memory device or may refer to both of the memory device 262 and the external memory device.

(2) Substrate Processing

Subsequently, the substrate processing of processing the wafer 200, which is a part of the manufacturing processes of the semiconductor device, will be described. The substrate processing is performed by using the above-described substrate processing apparatus 100. Hereinafter, the substrate processing will be described by way of an example in which a film is formed on the wafer 200. In particular, the substrate processing of the embodiments will be described by way of an example in which a silicon nitride film (also simply referred to as an "SiN film") serving as a silicon-containing film is formed on the wafer 200 by alternately supplying the DCS gas and the $NH_3$ gas onto the wafer 200. That is, the DCS gas is used as the source gas (first gas), and the $NH_3$ gas is used as the reactive gas (second gas). In the following descriptions, in the substrate processing, the operations of the components of the substrate processing apparatus 100 are controlled by the controller 260.

Figure 2:
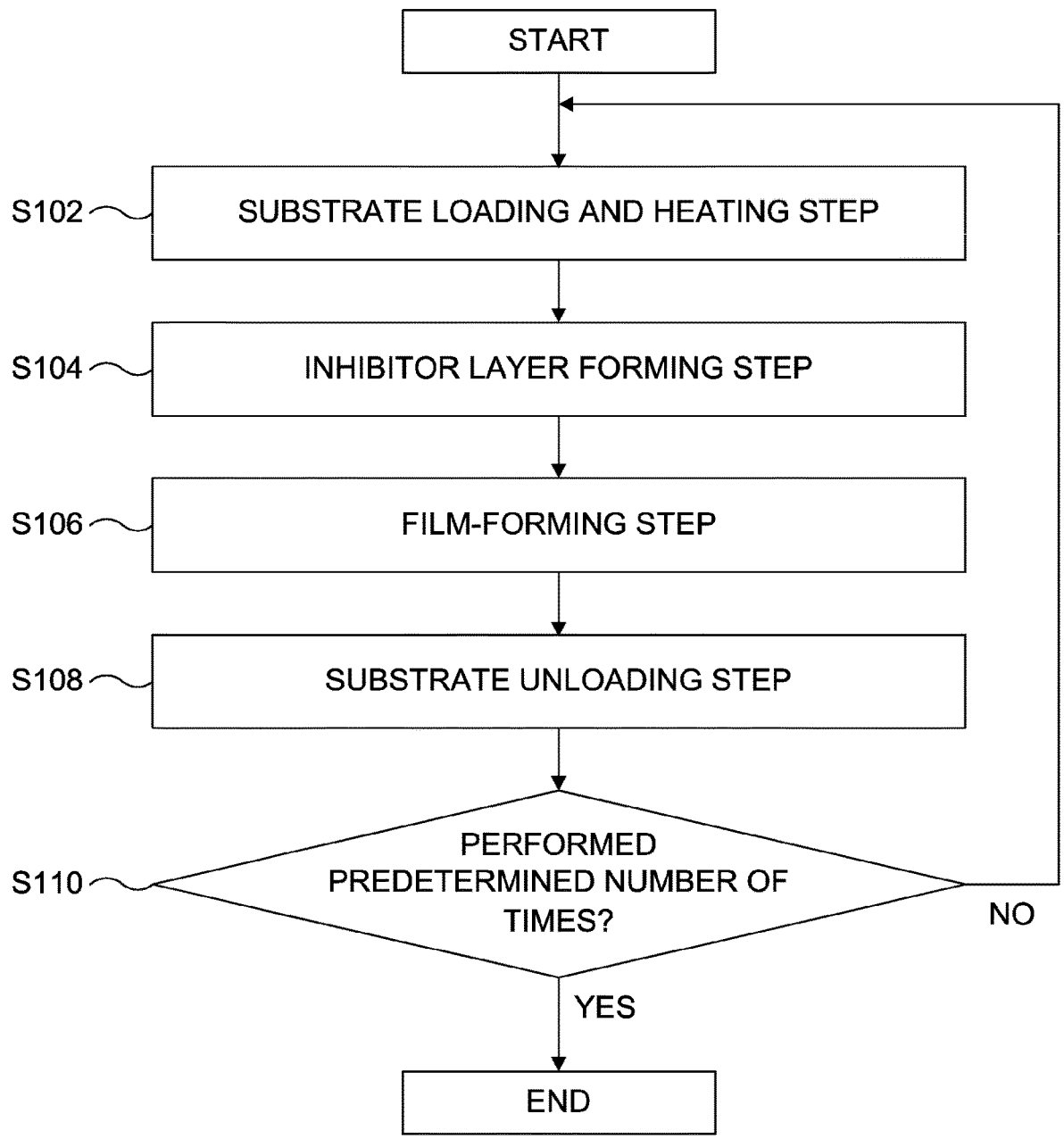
FIG. 2 is a flowchart schematically illustrating a substrate processing according to the embodiments described herein.
Figure 3:
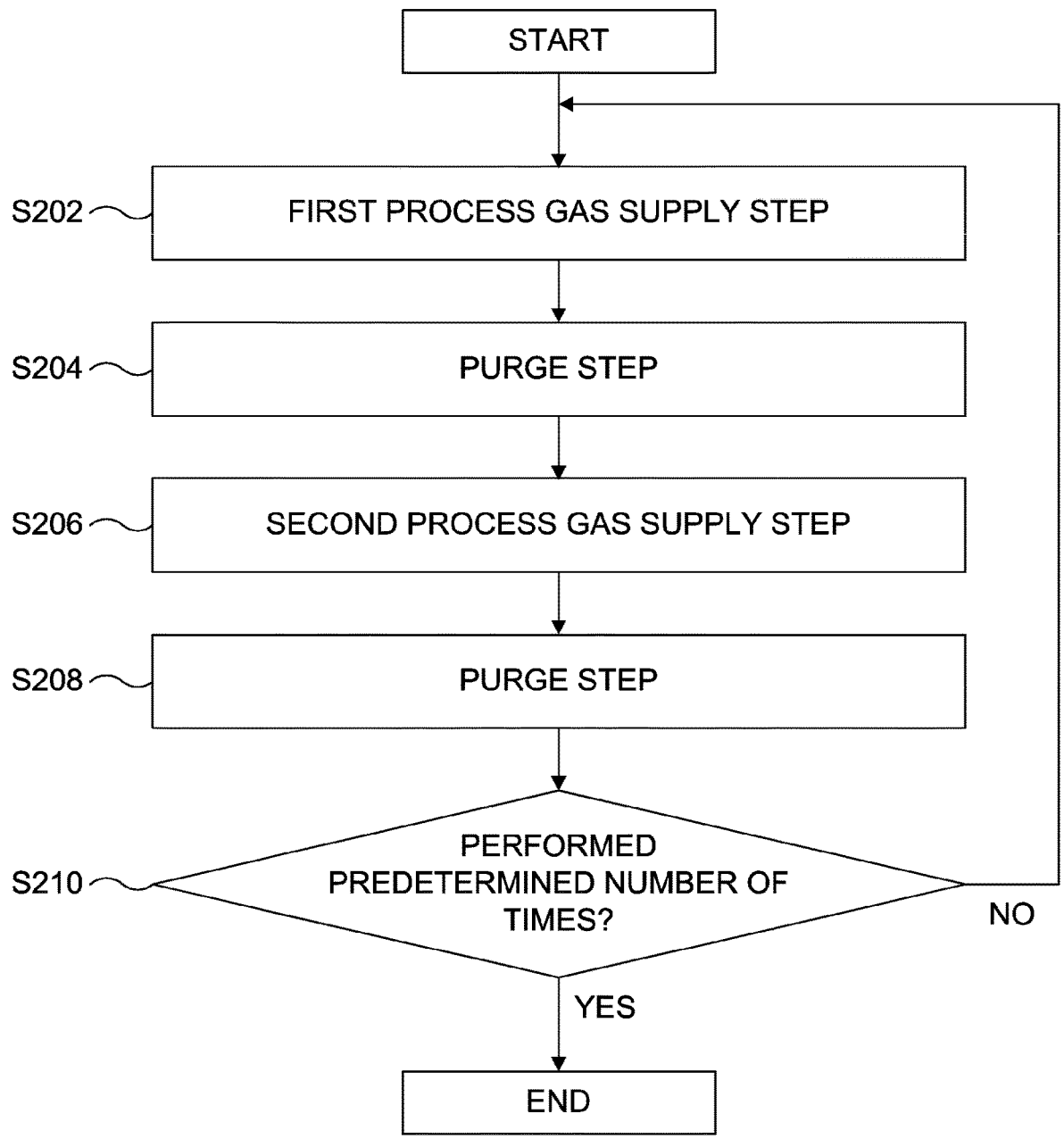
FIG. 3 is a flowchart schematically illustrating a film-forming step of the substrate processing shown in FIG. 2.

FIG. 2 is a flowchart schematically illustrating the substrate processing according to embodiments described herein. FIG. 3 is a flowchart schematically illustrating a film-forming step of the substrate processing shown in FIG. 2.

Substrate Loading and Heating Step S102

When the substrate processing is performed by using the substrate processing apparatus 100, first, as shown in FIG. 2, a substrate loading and heating step S102 is performed. In the substrate loading and heating step S102, the wafer 200 is transferred (loaded) into the process vessel 202. After the wafer 200 is loaded into the process vessel 202, a vacuum transfer robot (not shown) is retracted to an outside of the process vessel 202, and the gate valve 205 is closed to seal the process vessel 202 hermetically. Thereafter, by elevating the substrate support table 212, the wafer 200 is placed on the substrate placing surface 211 of the substrate support table 212. By further elevating the substrate support table 212, the wafer 200 is elevated to the position for processing the wafer 200 (that is, the wafer processing position) in the process chamber 201.

After the wafer 200 is loaded into the transfer chamber 203 and elevated to the wafer processing position in the process chamber 201, by operating (opening) the APC valve 223, the exhaust buffer chamber 209 communicates with the vacuum pump 224 via the APC valve 223. The APC valve 223 controls an exhaust flow rate of the exhaust buffer chamber 209 by the vacuum pump 224 by adjusting the conductance of the exhaust pipe 222. The inner pressure of the process chamber 201 communicating with the exhaust buffer chamber 209 is thereby maintained at a predetermined processing pressure.

When the wafer 200 is placed on the substrate support table 212, the electric power is supplied to the heater 213 embedded in the substrate support table 212 such that a temperature (surface temperature) of the wafer 200 is adjusted to a predetermined processing temperature. In the substrate loading and heating step S102, a temperature of the heater 213 is adjusted by controlling a state of electric conduction to the heater 213 based on temperature information detected by a temperature sensor (not shown).

In the substrate loading and heating step S102, the inner pressure of the process chamber 201 is adjusted to the predetermined processing pressure and the surface temperature of the wafer 200 is adjusted to the predetermined processing temperature. In the present specification, the predetermined processing temperature and the predetermined processing pressure refer to a processing temperature and a processing pressure, respectively, at which a film such as the inhibitor layer or the SiN film can be formed in an inhibitor layer forming step S104 or a film-forming step S106 described later. Specifically, for example, the processing temperature may range from the room temperature to 1,000° C., preferably from the room temperature to 800° C. For example, the processing pressure may range from 10 Pa to 2,000 Pa. The processing temperature and the processing pressure are also maintained in the inhibitor layer forming step S104 and the film-forming step S106 described later.

Inhibitor Layer Forming Step S104

After the substrate loading and heating step S102, the inhibitor layer forming step S104 is performed. In the inhibitor layer forming step S104, the CF$_4$ gas serving as the inhibitor layer forming gas (fifth gas) is supplied into the process chamber 201 through the inhibitor layer forming gas supply system 249.

Figure 4A:
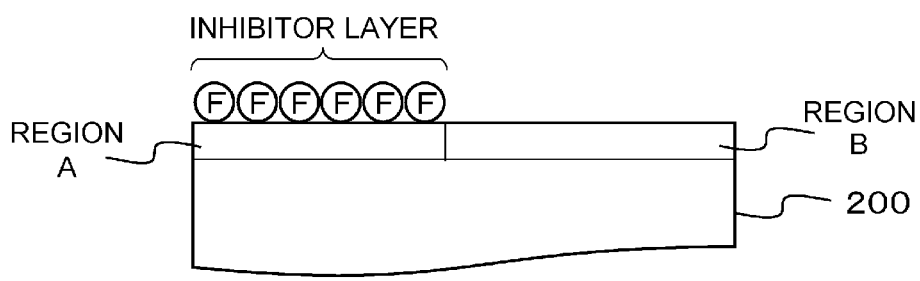
FIGS. 4A and 4B schematically illustrate processing states of a wafer before and after the film-forming step according to the embodiments described herein.
Figure 5A:
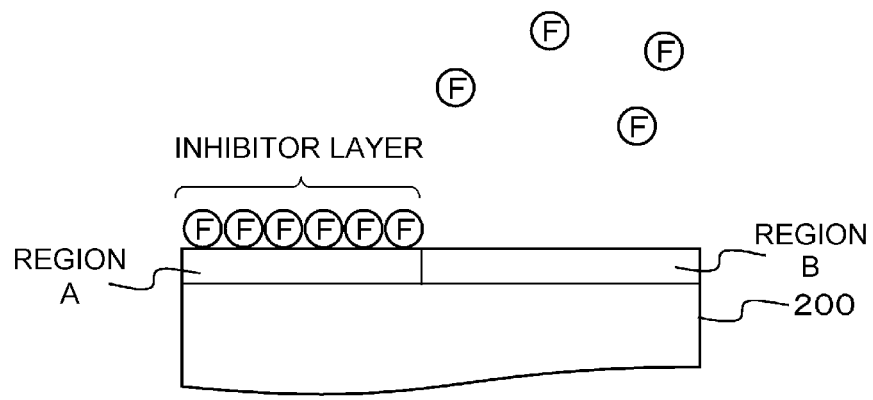
FIGS. 5A through 5C schematically illustrate processing states of a wafer before and after a film-forming step according to a comparative example.

As shown in FIGS. 4A and 5A, the wafer 200 includes a region A and a region B. Fluorine (F) is adsorbed onto a surface of the region A of the wafer 200, but is not adsorbed onto a surface of the region B of the wafer 200, For example, a mask (not shown) is provided on the region B but is not provided on the region A. The region A and the region B are made of, e.g., silicon.

Therefore, when the CF$_4$ gas is supplied onto the wafer 200, silicon contained in the region A reacts with the CF$_4$ gas. As a result, as shown in FIG. 4A, a fluorine-terminated (also referred to as a "SiF-terminated") inhibitor layer is formed on the region A. Since fluorine atoms exist on an uppermost surface of the region A after the inhibitor layer is formed, it may be described that the region A includes a fluorine-terminated surface.

After a predetermined time elapses from the supply of the CF$_4$ gas, the valve 249d is closed to stop the supply of the CF$_4$ gas.

Film-Forming Step S106

After the inhibitor layer forming step S104, the film-forming step S106 is performed. Hereinafter, the film-forming step S106 will be described in detail with reference to FIG. 3. As the film-forming step S106, a cyclic process may be performed by repeating alternately supplying different process gases (that is, by repeatedly and alternately performing a first process gas supply step S202 and a second process gas supply step S206 described later).

First Process Gas Supply Step S202

In the film-forming step S106, which corresponds to "(a) STEP" shown in FIG. 8, first, the first process gas supply step (source gas supply step) S202 is performed. In the first process gas supply step S202, the DCS gas serving as the source gas (first gas) is supplied into the process chamber 201 through the source gas supply system 243. The wafer 200 on which the inhibitor layer is formed on a portion of a surface thereof (that is, on the region A) is accommodated in the process chamber 201. The DCS gas supplied into the process chamber 201 is then supplied onto the surface of the wafer 200 at the wafer processing position. By supplying the DCS gas onto the wafer 200, a silicon-containing film containing chlorine (Cl) is formed on the surface of the region B of the wafer 200 on which no inhibitor layer is formed. The silicon-containing film containing chlorine may be formed by physical adsorption of the DCS gas on the surface of the region B, by chemical adsorption of substances generated by decomposing a part of the DCS gas on the surface of the region B, or by deposition of silicon generated by thermal decomposition of the DCS on the surface of the region B. For example, the silicon-containing film having a predetermined thickness and a predetermined distribution is formed according to the conditions such as an inner pressure of the process vessel 202 (that is, the inner pressure of the process chamber 201), a flow rate of the DCS gas supplied into the process chamber 201, a temperature of the substrate support table 212 and the time taken for the DCS gas to pass through the process chamber 201.

In the first process gas supply step S202, while suppressing the formation of the silicon-containing film on the surface of the region A of the wafer 200 on which the inhibitor layer is formed, it is possible to selectively form the silicon-containing film on the surface of the region B of the wafer 200 on which no inhibitor layer is formed. The fluorine-terminated inhibitor layer formed on the surface of the region A inhibits the formation of the silicon-containing film (that is, the adsorption of silicon) on the surface of the region A. That is, the fluorine-terminated inhibitor layer acts as an inhibitor. Therefore, it is possible to selectively form the silicon-containing film on the wafer 200. As described above, by the inhibitor layer inhibiting the adsorption of the process gas, the substrate acquires the selectivity in the adsorption of the process gas.

After a predetermined time elapses from the supply of the DCS gas, the valve 243d is closed to stop the supply of the DCS gas. In the first process gas supply step S202, the inner pressure of the process chamber 201 is controlled (adjusted) by the APC valve 223 to the predetermined processing pressure.

Purge Step S204

After the first process gas supply step S202, a purge step S204 is performed. In the purge step S204, the N$_2$ gas is supplied through the purge gas supply system 245 to purge the process chamber 201 and the shower head 230. As a result, the DCS gas that could not be bonded to the wafer 200 in the first process gas supply step S202 is removed from the process chamber 201 by the vacuum pump 224.

Second Process Gas Supply Step S206

Figure 4B:
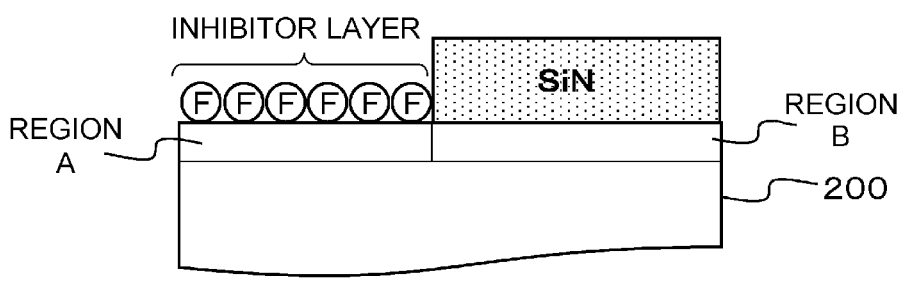

After the purge step S204, the NH$_3$ gas serving as the reactive gas (second gas) is supplied into the process chamber 201 through the reactive gas supply system 244. By supplying the NH$_3$ gas, at least a part of the silicon-containing film formed on the surface of the region B of the wafer 200 is nitrided (modified). By modifying the silicon-containing film, as shown in FIG. 4B, a film containing silicon and nitrogen (N), that is, the SiN film described above is formed on the surface of the region B of the wafer 200. When the SiN film is formed, impurities such as chlorine contained in the silicon-containing film may form a gas phase substance containing at least chlorine during a modifying reaction of the silicon-containing film by the NH$_3$ gas, and the gas phase substance is discharged from the process chamber 201. Thereby, the SiN film becomes a layer which contains a smaller amount of the impurities such as chlorine than the silicon-containing film formed in the first process gas supply step S202. The surface of the region A is maintained without being modified even when the second process gas supply step S206 is performed. That is, the surface of the region A is maintained stable (that is, terminated with fluorine (F)) without being modified (that is, without being NH-terminated).

The NH$_3$ gas may be activated into a plasma state by the matching mechanism 251 and the high frequency power supply 252 and then irradiated (supplied) onto the surface of the wafer 200. In addition, when the NH$_3$ gas is supplied, the bias may be applied to the wafer 200 by applying the bias voltage to the bias electrode 220. The bias voltage applied to the bias electrode 220 may be adjusted by the impedance adjusting mechanism 270.

After a predetermined time elapses from the supply of the NH$_3$ gas, the valve 244d is closed to stop the supply of the NH$_3$ gas. Similar to the first process gas supply step S202, the inner pressure of the process chamber 201 in the second process gas supply step S206 is controlled (adjusted) by the APC valve 223 to the predetermined processing pressure.

Purge Step S208

After the second process gas supply step S206, a purge step S208 is performed. The operations of the components of the substrate processing apparatus 100 in the purge step S208 is similar to those of the components in the purge step S204. Therefore, the detailed descriptions of the purge step S208 are omitted.

Determination Step S210

Hereinafter, a determination step S210 will be described. After the purge step S208 is completed, in the determination step S210, the controller 260 determines whether a cycle including the first process gas supply step S202 through the purge step S208 has been performed a predetermined number of times (n times). When the controller 260 determines, in the determination step S210, that the cycle has not been performed the predetermined number of times (n times) ("NO" in FIG. 3), the first process gas supply step S202 through the purge step S208 are performed again. When the controller 260 determines, in the determination step S210, that the cycle has been performed the predetermined number of times (n times) ("YES" in FIG. 3), the film-forming step S106 is terminated.

As described above, in the film-forming step S106, by sequentially performing the first process gas supply step S202 through the purge step S208, the SiN film is selectively formed on the surface of the region B among the region A and the region B of the wafer 200. By performing the cycle including the first process gas supply step S202 through the purge step S208 a predetermined number of times, it is possible to control the thickness of the SiN film formed on the surface of the wafer 200 to a desired thickness.

Substrate Unloading Step S108

After the film-forming step S106 is completed, as shown in FIG. 2, a substrate unloading step S108 is performed by the substrate processing apparatus 100. In the substrate unloading step S108, the processed wafer 200 is transferred (unloaded) out of the process vessel 202 in the order reverse to that of the substrate loading and heating step S102. Subsequent to a determination step S110 described later, an unprocessed wafer 200 may be loaded into the process vessel 202 in the order same as that of the substrate loading and heating step S102. The loaded wafer 200 will be subject to the inhibitor layer forming step S104 and the film-forming step S106 thereafter.

Determination Step S110

After the substrate unloading step S108 is completed, in the determination step S110, the controller 260 of the substrate processing apparatus 100 determines whether a cycle including the substrate loading and heating step S102, the inhibitor layer forming step S104, the film-forming step S106 and the substrate unloading step S108 has been performed a predetermined number of times. That is, the controller 260 determines whether the number of wafers including the wafer 200 processed in the film-forming step S106 is equal to the predetermined number. When it is determined, in the determination step S110, that the cycle has not been performed the predetermined number of times ("NO" in FIG. 2), the substrate loading and heating step S102, the inhibitor layer forming step S104, the film-forming step S106 and the substrate unloading step S108 are performed again to process the unprocessed wafer 200. When it is determined, in the determination step S110, that the cycle has been performed the predetermined number of times ("YES" in FIG. 2), the substrate processing is terminated.

When the substrate processing is completed, no wafer is accommodated in the process vessel 202.

(3) Cleaning Step of Process Chamber

Subsequently, a cleaning step (also referred to as the "process space cleaning step") of performing a cleaning process to the inside of the process vessel 202 such as the process chamber 201 of the substrate processing apparatus 100, which is a part of the manufacturing processes of the semiconductor device, will be described.

When the substrate processing described above is repeatedly performed, the unnecessary reactants such as the by-products may be attached to a surface of a wall in the process vessel 202 (particularly, in the process chamber 201). Therefore, the substrate processing apparatus 100 performs the cleaning step of the process chamber 201 (that is, the process space cleaning step) at a predetermined timing (for example, after performing the substrate processing a predetermined number of times, after processing a predetermined number of wafers including the wafer 200 or after a predetermined time has elapsed from the previous cleaning process).

In the cleaning step of the process chamber 201, which corresponds to "(b) STEP" shown in FIG. 8, the valve 248$d$ is opened while the valves 243$d$, 244$d$, 245$d$, 246$d$, 247$d$, 249$d$ and 250$d$ are closed. Thereby, the cleaning gas is supplied into the process chamber 201, in which no wafer is accommodated, from the process space cleaning gas supply source 248$b$ via the third gas supply pipe 245$a$ and the common gas supply pipe 242. According to the embodiments, the $NF_3$ gas containing a fluorine (F) molecule which is the same component contained in the inhibitor layer is supplied into the process chamber 201 as the cleaning gas. Then, the $NF_3$ gas supplied into the process chamber 201 removes attached substances such as the reaction by-products in the buffer space 232 or in the process chamber 201.

As a result, for example, even when the substances such as the by-products attached to the surface of the wall in the process chamber 201, it is possible to remove the substances such as the by-products by performing the cleaning step of the process chamber 201 at the predetermined timing.

After a predetermined time elapses and the cleaning step of the process chamber 201 is completed, the valve 248$d$ is closed to stop the supply of the $NF_3$ gas into the process chamber 201. The inner atmosphere of the process chamber 201 is purged in the same manners as in the purge step S204 and the purge step S208 of the film-forming step S106. That is, a purge step is performed.

(4) Cleaning Gas Residual Component Removing Step

Subsequently, a cleaning gas residual component removing step of removing the residual component of the cleaning gas remaining in the process chamber 201 of the substrate processing apparatus 100, which is a part of the manufacturing processes of the semiconductor device, will be described.

Figure 5B:
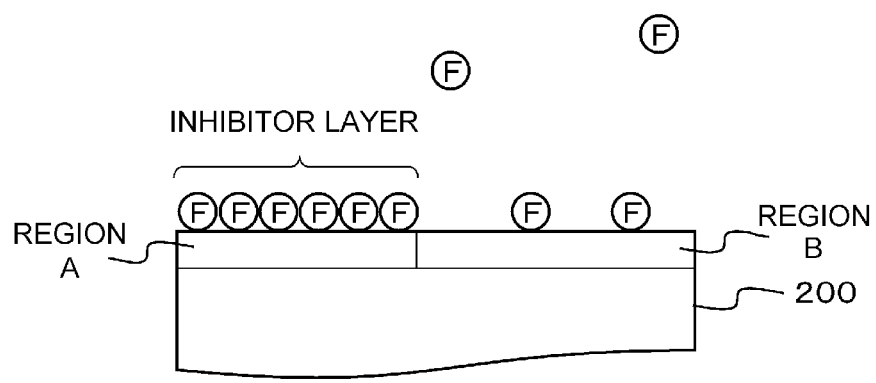

When the cleaning step of the process chamber 201 described above is performed, the residual component of the $NF_3$ gas such as a nitrogen (N) molecule and the fluorine (F) molecule may remain in the process chamber 201. In this case, when the SiN film is selectively formed on the wafer 200 that the inhibitor layer is formed on the portion of the surface thereof (that is, on the region A), as shown in FIGS. 5A and 5B, the residual component such as the fluorine molecule may be attached to a portion of the wafer 200 on which no inhibitor layer is formed (that is, on the region B).

Figure 5C:
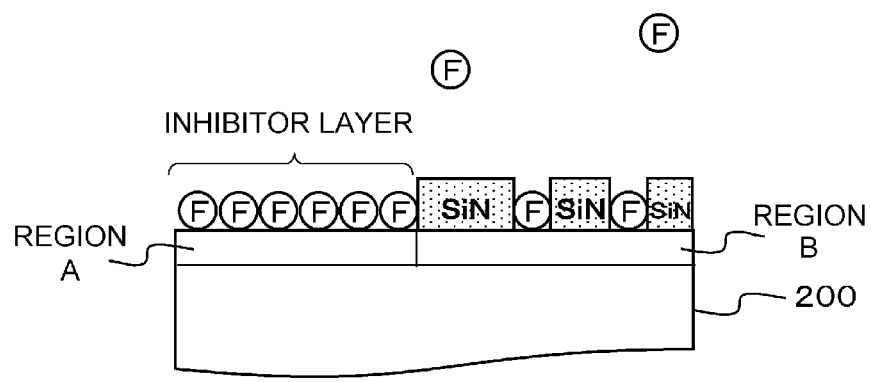

As described above, the fluorine molecule contained in the $NF_3$ gas is the same fluorine component contained in the inhibitor layer. As a result, the fluorine molecule contained in the $NF_3$ gas may also act as the inhibitor of inhibiting the formation of the SiN film on the wafer 200. Therefore, when the fluorine molecules remaining in the process chamber 201 are attached to the portion of the wafer 200 on which no inhibitor layer is formed (that is, on the region B), as shown in FIG. 5C, there may arise an untended phenomenon that the SiN film may not be formed on a portion of the region B to which the fluorine molecule attached. As described above, when the residual component of the cleaning gas containing the same component contained in the inhibitor layer remains in the process chamber 201, the film (that is, the SiN film) may not be selectively formed by the film-forming step S106.

Therefore, according to the embodiments, the cleaning gas residual component removing step (hereinafter, also simply referred to as a "residual component removing step") of removing the residual component of the cleaning gas remaining in the process chamber 201 is performed after performing the cleaning step of the process chamber 201 in order to selectively form the film in the film-forming step S106.

Specifically, in the residual component removing step, which corresponds to "(c) STEP" shown in FIG. 8, the H2 gas serving as the residual component removing gas (sixth gas) is supplied into the process chamber 201 through the residual component removing gas supply system 250. The high frequency power is supplied into the process chamber 201 using the matching mechanism 251 and the high frequency power supply 252. Thereby, the H2 gas in the process chamber 201 is activated into a plasma state to generate a hydrogen plasma.

When the hydrogen plasma is generated, a hydrogen molecule is activated and reacts with the F molecule, which is the residual component of the $NF_3$ gas in the process chamber 201 or the shower head 230, to generate hydrogen fluoride (HF). Thereafter, in order to remove the residual component of the cleaning gas, the HF is exhausted to an outside of the process vessel 202 through the exhaust buffer chamber 209 and the exhaust pipe 222.

When the bias voltage is applied to the bias electrode 220 in the film-forming step S106, the hydrogen plasma generated in the residual component removing step is restricted such that it is forced to follow a bias direction. Therefore, the hydrogen plasma may easily concentrate on the surface of the wafer 200. On the other hand, the fluorine (F) molecule which is the residual component of the $NF_3$ gas is easily adsorbed to a lower temperature portion above the wafer 200, for example, a corner portion distanced away from the heater 213. Therefore, in order to efficiently remove the fluorine molecule in the process chamber 201, it is preferable to move the hydrogen plasma upward from the surface of the wafer 200. In other words, it is preferable to generate the hydrogen plasma at a position above the surface of the wafer 200 (that is, a second position) rather than a position where the plasma of the process gas is generated (that is, a first position on the surface of the wafer 200).

As a method of generating the hydrogen plasma at the second position, for example, the application of the bias voltage to the bias electrode 220 may be stopped. When the application of the bias voltage to the bias electrode 220 is stopped, a moving direction of the hydrogen molecule constituting the hydrogen plasma is not limited. As a result, the hydrogen molecule can diffuse isotropically and reach the second position.

As described above, by performing the residual component removing step to remove the fluorine molecule which is the residual component of the cleaning gas, it is possible to selectively form the film in the film-forming step S106 performed after the residual component removing step.

(5) Effects According to Embodiments

According to the embodiments described above, it is possible to provide at least one or more of the following effects.

(a) According to the embodiments, the residual component removing step of removing the residual component of the cleaning gas is performed as a part of the manufacturing processes of the semiconductor device. Therefore, it is possible to remove the residual component of the cleaning gas containing the same component contained in the inhibitor layer. Accordingly, in the film-forming step S106, it is possible to prevent the residual component of the cleaning gas serving as the inhibitor from attaching to the wafer 200. Therefore, it is possible to selectively form the film.

(b) According to the embodiments, in the residual component removing step, the plasma of the hydrogen-containing gas such as the $H_2$ gas is generated in the process chamber 201 so as to activate the hydrogen molecule. As a result, it is possible to efficiently remove the residual component of the cleaning gas.

(c) According to the embodiments, the position of the plasma of the hydrogen-containing gas generated in the residual component removing step (that is, the second position described above) is higher than the position of the plasma of the process gas generated in the film-forming step S106 (that is, the first position described above). Thereby, it is possible to generate the plasma of the hydrogen-containing gas at a portion above the wafer 200 (that is, the lower temperature portion above the wafer 200) where the residual component of the cleaning gas is easily adsorbed. As a result, it is possible to more efficiently remove the residual component of the cleaning gas.

Other Embodiments

While the technique is described in detail by way of the above-described embodiments, the above-described technique is not limited thereto. The above-described technique may be modified in various ways without departing from the gist thereof.

(a) According to the embodiments described above, the order in which the film-forming step S106 corresponding to the "(a) STEP", the cleaning step of the process chamber 201 corresponding to the "(b) STEP" and the residual component removing step corresponding to the "(c) STEP" are not particularly limited. However, as shown in FIG. 8, the substances such as the by-products attached to the inside of the process chamber 201 by repeatedly performing the "(a) STEP" are removed by performing the "(b) STEP". Then, the residual component of the cleaning gas remaining in the process chamber 201 after performing the "(b) STEP" is removed by performing the "(c) STEP". As described above, by removing the residual component of the cleaning gas by performing the "(c) STEP", it is possible to reliably prevent the residual component of the cleaning gas serving as the inhibitor from attaching to the wafer 200 in the subsequent "(a) STEP". Therefore, when the "(b) STEP", the "(c) STEP" and the "(a) STEP" are performed in this order, it is possible to more reliably and selectively form the film.

(b) For example, the embodiments are described by way of an example in which the fluorine-containing gas is used as the inhibitor layer forming gas. However, the above-described technique is not limited thereto. For example, a chlorine (Cl)-containing gas may be used as the inhibitor layer forming gas. When the chlorine-containing gas is used as the inhibitor layer forming gas, a chlorine-terminated inhibitor layer is formed on the surface of the region A of the wafer 200. Therefore, a chlorine-containing gas is also used as the cleaning gas.

(c) For example, the embodiments are described by way of an example in which the inhibitor layer forming step S104 is performed in the process chamber 201. However, the above-described technique is not limited thereto. For example, the wafer 200 on which the inhibitor layer is formed by another substrate processing apparatus is transferred into the process chamber 201, and the film-forming step S106 is performed to the wafer 200. Thereby, it is possible to manufacture the semiconductor device according to specifications of a factory where the semiconductor device is manufactured.

(d) For example, the embodiments are described by way of an example in which the application of the bias voltage to the bias electrode 220 is stopped in order to generate the hydrogen plasma at the second position above the first position on the surface of the wafer 200. However, the above-described technique is not limited thereto. For example, a ring bias electrode 300 may be used.

Figure 6:
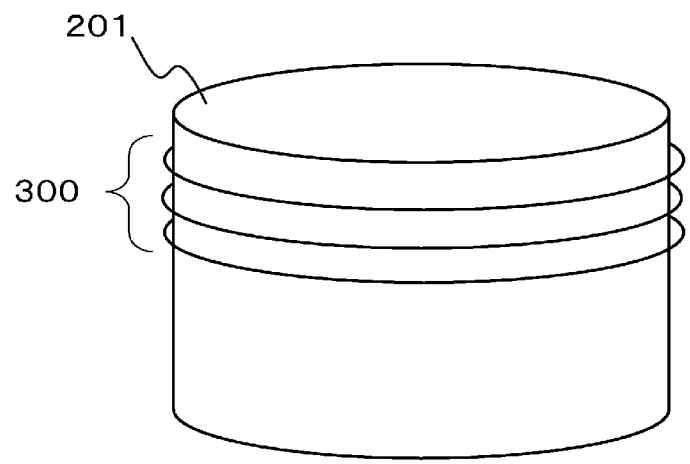
FIG. 6 is a perspective view schematically illustrating a substrate processing apparatus preferably used in other embodiments described herein.

As shown in FIG. 6, the ring bias electrode 300 is provided so as to wind an outer peripheral surface of the process chamber 201 a plurality of times. Therefore, by applying the bias voltage to the ring bias electrode 300, it is possible to generate the hydrogen plasma on a surface of an inner wall of the process chamber 201 at a position corresponding to the ring bias electrode 300. By providing the ring bias electrode 300 at a position (that is, the second position) above the surface of the wafer 200 rather than a position (that is, the first position) on the surface of the wafer 200, the hydrogen plasma is generated at the second position. As a result, it is possible to efficiently remove the residual component of the cleaning gas adsorbed in a ring shape on the surface of the inner wall above the surface of the wafer 200.

The bias voltage applied to the ring bias electrode 300 may be adjusted by an impedance adjusting mechanism (not shown) connected to the ring bias electrode 300. When the bias voltage is applied to the bias electrode 220 in the film-forming step S106, it is preferable to stop applying the bias voltage to the bias electrode 220 and then apply the bias voltage to the ring bias electrode 300.

Figure 7:
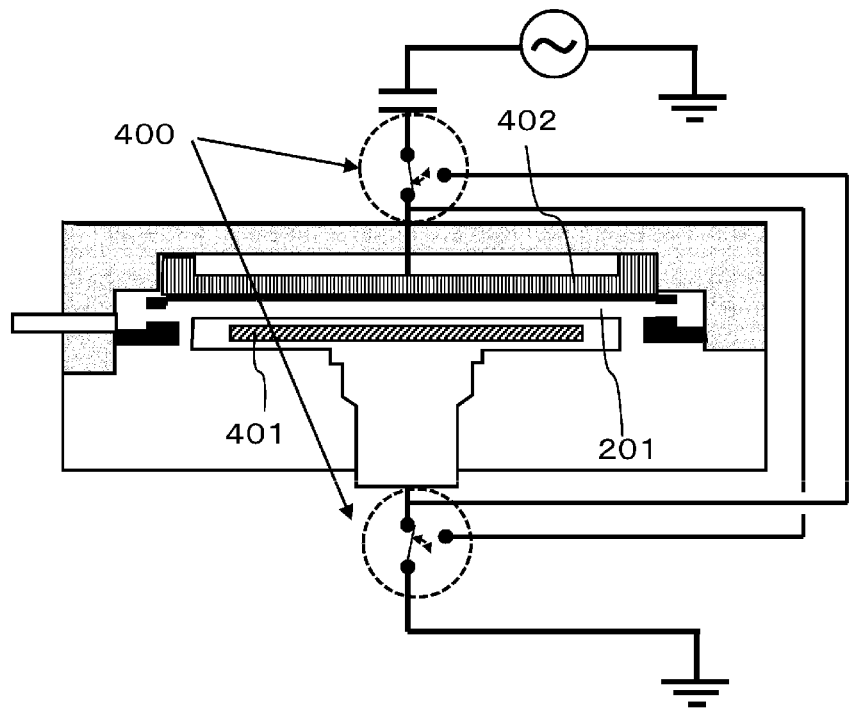
FIG. 7 schematically illustrates the substrate processing apparatus preferably used in the other embodiments described herein.

(e) Instead of stopping the application of the bias voltage to the bias electrode 220, as shown in FIG. 7, the application of the bias voltage may be switched between two bias electrodes 401 and 402 using a switching mechanism 400 in order to generate the hydrogen plasma at the second position above the first position on the surface of the wafer 200.

By switching the application of the bias voltage from the bias electrode 401 to the bias electrode 402, it is possible to generate the hydrogen molecule of the hydrogen plasma at the second position above the first position on the surface of the wafer 200. Therefore, by using the switching mechanism 400 as described above, it is possible to efficiently remove the residual component of the cleaning gas adsorbed at an upper portion of the process chamber 201.

(f) For example, the above-described embodiments are described by way of an example in which the SiN film is formed on the wafer 200 by alternately supplying the DCS gas serving as the source gas (first gas) and the NH$_3$ gas serving as the reactive gas (second gas). However, the above-described technique is not limited thereto. For example, the process gases used in the film-forming process are not limited to the DCS gas and the NH$_3$ gas. That is, the above-described technique may also be applied to film-forming processes wherein other gases are used to form different films, or three or more different process gases are alternately supplied to form a film.

(g) For example, the above-described embodiments are described by way of an example in which the hydrogen plasma used in the residual component removing step is generated in the process chamber 201. However, the above-described technique is not limited thereto. For example, the hydrogen plasma may be generated in a remote plasma mechanism (also referred to as a "remote plasma unit" or "RPU") (not shown) provided outside the process chamber 201.

(h) For example, the above-described embodiments are described by way of an example in which, by the inhibitor layer, the substrate can acquire the selectivity in the adsorption of the process gas. That is, by providing the inhibitor layer, it is possible to inhibit the adsorption of the silicon contained in the DCS gas supplied in the film-forming step S106. However, the above-described technique is not limited thereto. For example, instead of the inhibitor layer, a promoter layer of promoting the adsorption of the silicon contained in the DCS gas may be used. When the promoter layer is used, it is possible to inhibit the adsorption of the silicon contained in the DCS gas on the portion of the surface of wafer 200 on which no promoter layer is formed.

According to some embodiments in the present disclosure, it is possible to selectively form the film in the film-forming step.

What is claimed is:

1. A method of manufacturing a semiconductor device comprising:
   (a) selectively forming a film on a substrate by supplying a process gas into a process chamber accommodating the substrate with applying a bias voltage to the substrate, wherein an inhibitor layer is formed on a portion of the substrate such that the substrate acquires a selectivity in an adsorption of the process gas;
   (b) supplying a cleaning gas containing a component contained in the inhibitor layer into the process chamber accommodating no substrate; and
   (c) supplying plasma of a hydrogen-containing gas to be combined with a residual component of the cleaning gas in the process chamber and removing a combined gas of the residual component of the cleaning gas and a hydrogen component of the hydrogen-containing gas in the process chamber,
   wherein (c) is performed after (b) is performed, and (a) is performed after (c) is performed, and
   wherein (c) comprises: generating the plasma of the hydrogen-containing gas by supplying a high frequency power into the process chamber while an application of the bias voltage is stopped.

2. The method of claim 1, wherein the component contained in the inhibitor layer comprises fluorine.

3. The method of claim 1, wherein plasma of the process gas is generated at a first position in (a), the plasma of the hydrogen-containing gas is generated at a second position higher than the first position in the process chamber in (c).

4. The method of claim 2, wherein plasma of the process gas is generated at a first position in (a), the plasma of the hydrogen-containing gas is generated at a second position higher than the first position in the process chamber in (c).

5. The method of claim 1, wherein the component contained in the inhibitor layer comprises chlorine.

6. The method of claim 5, wherein plasma of the process gas is generated at a first position in (a), the plasma of the hydrogen-containing gas is generated at a second position higher than the first position in the process chamber in (c).

* * * * *